(12) United States Patent
Lau et al.

(10) Patent No.: US 12,033,874 B2
(45) Date of Patent: Jul. 9, 2024

(54) EPI CHAMBER WITH FULL WAFER LASER HEATING

(71) Applicant: Applied Materials, Inc., Santa Clara, CA (US)

(72) Inventors: Shu-Kwan Danny Lau, Sunnyvale, CA (US); Adel George Tannous, Santa Clara, CA (US); Patrick C. Genis, Boulder Creek, CA (US); Zhiyuan Ye, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 674 days.

(21) Appl. No.: 17/011,781

(22) Filed: Sep. 3, 2020

(65) Prior Publication Data

US 2022/0068675 A1 Mar. 3, 2022

(51) Int. Cl.
*H01L 21/67* (2006.01)
(52) U.S. Cl.
CPC .............................. *H01L 21/67115* (2013.01)
(58) Field of Classification Search
CPC ......... H01L 21/67115; H01L 21/68714; H01L 21/67; H01L 39/22; H04N 9/73; G01R 33/035; G01R 33/06; G01R 33/09
See application file for complete search history.

(56) References Cited

U.S. PATENT DOCUMENTS

| | | | |
|---|---|---|---|
| 8,107,801 B2* | 1/2012 | Shimizu | ............ H01L 21/67115 392/407 |
| 8,138,451 B2 | 3/2012 | Gat et al. | |
| 10,103,040 B1 | 10/2018 | Oosterlaken et al. | |
| 10,950,472 B2* | 3/2021 | Yamada | ............ H01L 21/67115 |
| 2008/0017117 A1 | 1/2008 | Campbell et al. | |
| 2008/0187299 A1* | 8/2008 | Shimizu | ............ H01L 21/67109 392/418 |
| 2010/0180918 A1 | 7/2010 | Maekawa | |
| 2011/0174790 A1* | 7/2011 | Suzuki | ............ H01L 21/67115 219/121.84 |
| 2014/0246422 A1 | 9/2014 | Koren et al. | |
| 2015/0340257 A1* | 11/2015 | Brillhart | ........... H01L 21/67201 392/416 |

(Continued)

FOREIGN PATENT DOCUMENTS

| JP | H9326367 A | 12/1997 |
|---|---|---|
| JP | 2003-077857 A | 3/2003 |

(Continued)

OTHER PUBLICATIONS

International Search Report and Written Opinion dated Dec. 3, 2021 for application No. PCT/US2021/045579.

(Continued)

*Primary Examiner* — Dana Ross
*Assistant Examiner* — Adam M Eckardt
(74) *Attorney, Agent, or Firm* — Patterson + Sheridan, LLP

(57) ABSTRACT

An apparatus for heating a substrate within a thermal processing chamber is disclosed. The apparatus includes a chamber body, a gas inlet, a gas outlet, an upper window, a lower window, a substrate support, and an upper heating device. The upper heating device is a laser heating device and includes one or more laser assemblies. The laser assemblies include light sources, a cooling plate, optical fibers, and irradiation windows.

20 Claims, 9 Drawing Sheets

(56) References Cited

U.S. PATENT DOCUMENTS

2017/0103907 A1* 4/2017 Chu .................. H01L 21/68764
2018/0001548 A1   1/2018 Dietrich et al.
2019/0127851 A1   5/2019 Lau et al.
2020/0373195 A1* 11/2020 Lau .................. H01L 21/67103

FOREIGN PATENT DOCUMENTS

| | | | |
|---|---|---|---|
| JP | 2003077857 A | * | 3/2003 |
| JP | 2007-116072 A | | 5/2007 |
| JP | 2010-034491 A | | 2/2010 |
| JP | 201232401 A | | 2/2012 |
| JP | 2018046141 A | | 3/2018 |
| KR | 10-2013-0098663 A | | 9/2013 |

OTHER PUBLICATIONS

Office Action for Japanese Application No. 2022-563145 dated Dec. 12, 2023.

* cited by examiner

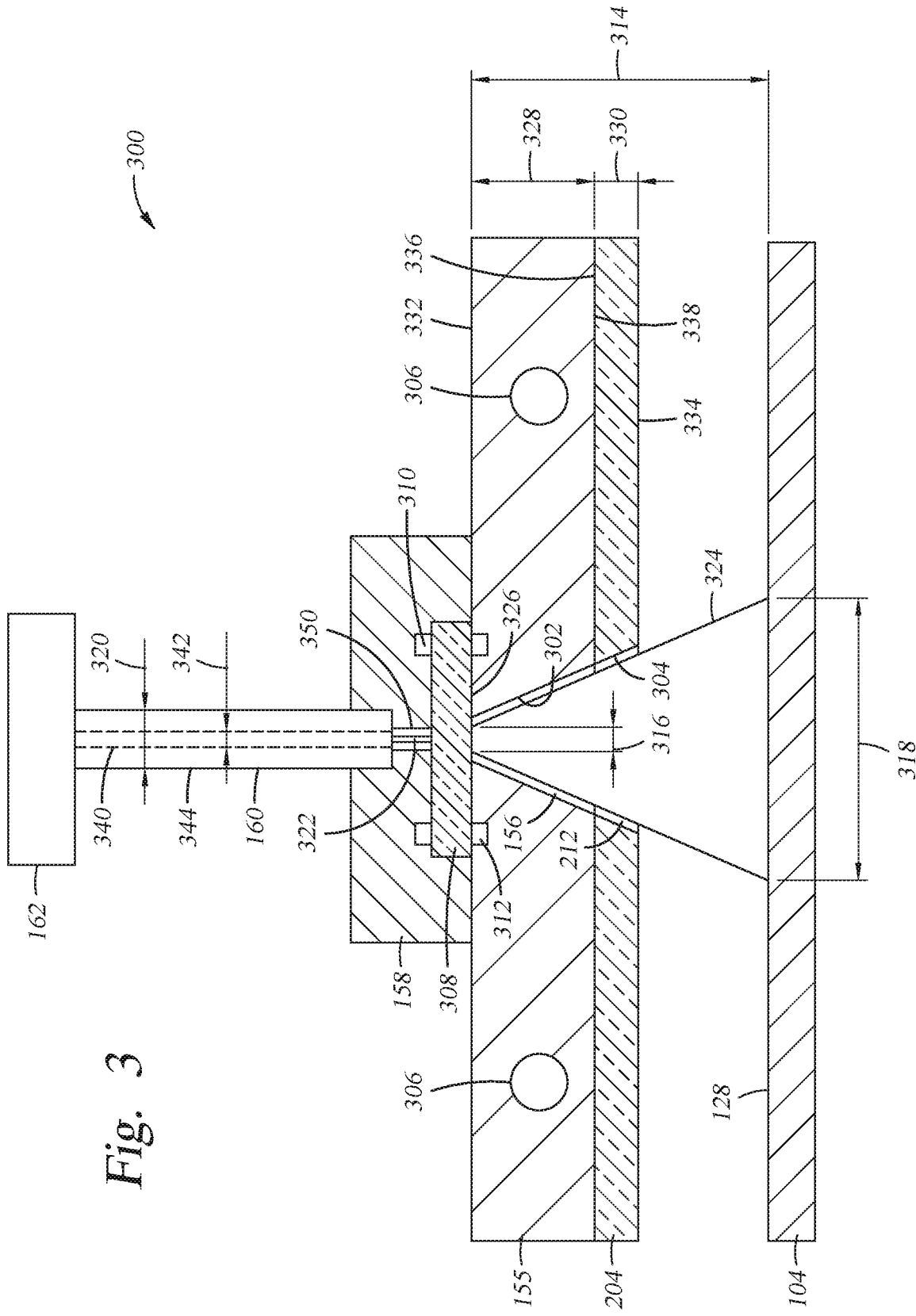

EPI CHAMBER WITH FULL WAFER LASER HEATING

BACKGROUND

Field

Embodiments described herein generally relate to a laser heating system within a thermal process chamber, More specifically, embodiments described herein relate to a laser heating assembly with one or more lasers disposed through a cooling plate and oriented to heat a substrate within the thermal process chamber.

Description of the Related Art

Semiconductor substrates are processed for a wide variety of applications, including the fabrication of integrated devices and microdevices. However, conventional hardware for processing substrates is large and requires a large variety of chamber components. Additionally, conventional hardware suffers from a lack of process of process variability.

Previous attempts at decreasing the chamber complexity and increasing process flexibility for epitaxial processing have encountered limitations due to the use of lamps as the primary source of chamber heating. Moreover, conventional attempts are costly and have a large footprint that occupies a large area within a workspace. Therefore, a need exists for an improved thermal process chamber in semiconductor processing.

SUMMARY

The present disclosure generally relates to apparatus and methods for semiconductor processing in a thermal processing chamber. In one embodiment, the chamber for substrate processing includes a chamber body, a gas inlet disposed through a sidewall of the chamber body, a gas outlet disposed through a sidewall of the chamber body and opposite the gas inlet, an upper window, a lower window, and an upper heating device. The upper heating device includes an upper cooling plate, one or more upper base members disposed on the upper cooling plate, one or more upper light sources, one or more optical fibers connected to the one or more upper light sources at a first end and the upper base member at a second end, and an irradiation window disposed within the upper base member and between the one or more optical fibers and the upper window.

In another embodiment, a chamber for substrate processing includes a chamber body, a gas inlet disposed through a sidewall of the chamber body, a gas outlet disposed through a sidewall of the chamber body and opposite the gas inlet, an upper window, a lower window, an upper heating device, and a lower heating device. The upper heating device includes an upper cooling plate with a one or more openings disposed therethrough, one or more upper base members disposed on the upper cooling plate, one or more upper light sources, one or more optical fibers connected to the one or more upper light sources and the upper base member, and an irradiation window disposed within the upper base member and between the one or more optical fibers and the upper window.

In yet another embodiment, a chamber for substrate processing includes a chamber body, a gas inlet disposed through a sidewall of the chamber body, a gas outlet disposed through a sidewall of the chamber body and opposite the gas inlet, an upper window, a lower window, a substrate support disposed between the upper window and the lower window, an upper heating device, and a lower heating device. The upper heating device includes an upper cooling plate with a one or more openings disposed therethrough, one or more upper base members disposed on the upper cooling plate, one or more upper light sources, one or more optical fibers connected to the one or more upper light sources and the upper base member, and an irradiation window disposed within the upper base member and between the one or more optical fibers and the upper window. A divergent laser is supplied by the one or more upper light sources to the optical fibers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 3 illustrates a schematic cross-sectional view of a laser assembly similar to that found in any of FIG. 1A-1B or 2A-2B.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus and methods for semiconductor processing, more particularly, to a thermal process chamber. The thermal processing chamber is an epitaxial deposition chamber. The thermal processing chamber includes a substrate support, a chamber body, a gas inlet disposed through a sidewall of the chamber body, a gas outlet disposed through a sidewall of the chamber body and opposite the gas inlet, an upper window, a lower window, and an upper heating device. The upper heating device includes an upper cooling plate, one or more upper base members disposed on the upper cooling plate, one or more upper light sources, one or more optical fibers connected to the one or more upper light sources at a first end and the upper base member at a second end, and an irradiation window disposed within the upper base member and between the one or more optical fibers and the upper window.

The embodiments described herein utilize a laser heating apparatus designed to heat a substrate. The laser heating apparatus is designed to heat the entirety of the surface of a substrate which is disposed within an epitaxial deposition chamber. The utilization of the laser heating apparatus allows for more direct control of the heating of the substrate. As described herein, existing epitaxial deposition chambers may be retrofit with laser heating apparatus, such that the laser heating apparatus are used in a chamber containing upper and lower quartz windows. The laser heating apparatus may alternatively allow for the formation of different epitaxial deposition structures, such that the processing chamber is dramatically simplified and built for the utilization of laser heating apparatus in lieu of lamp assemblies.

Figure 1A:
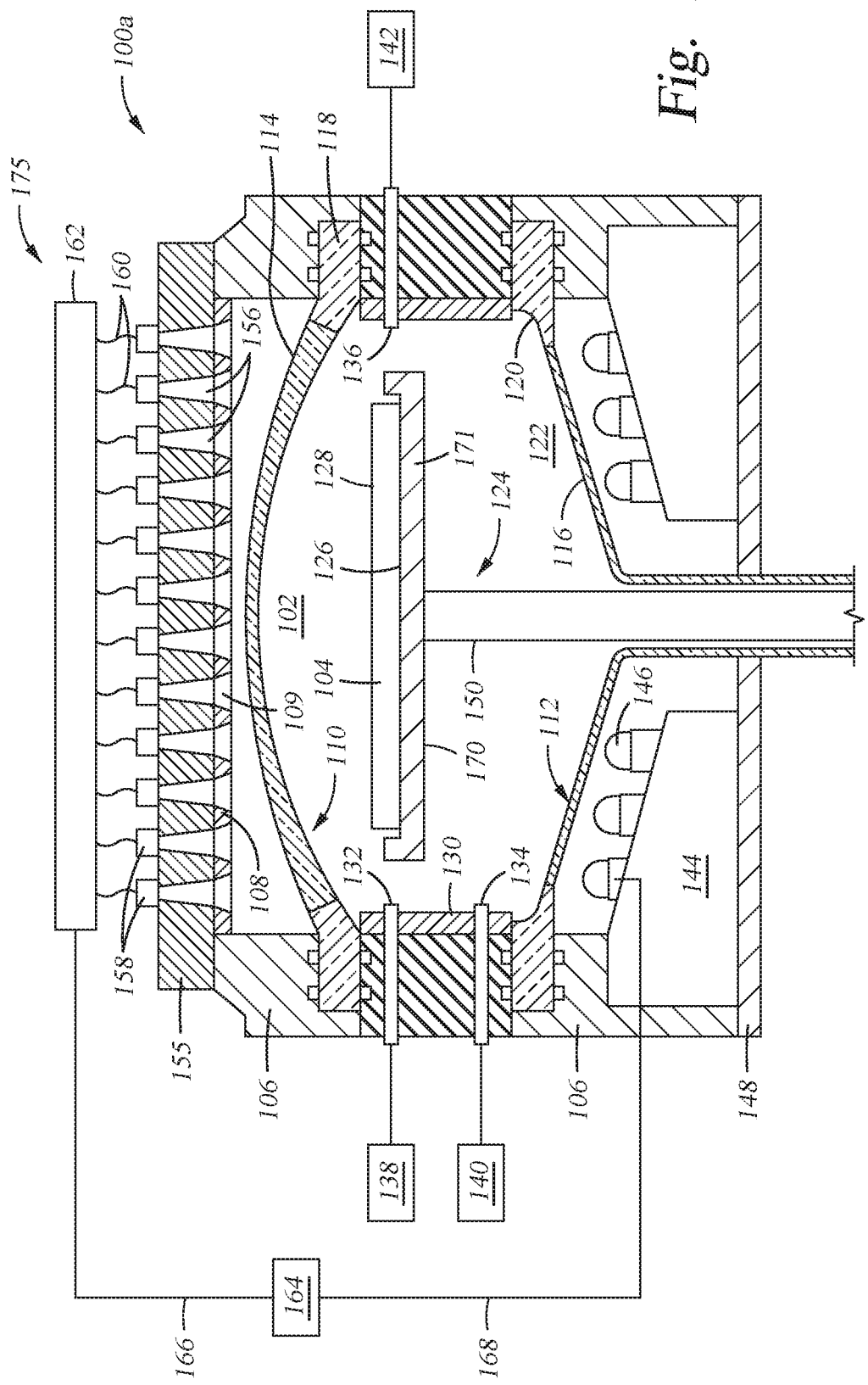
FIGS. 1A-1B illustrate schematic cross-sectional views of a processing chamber according to a first embodiment and a second embodiment described herein.
Figure 1B:
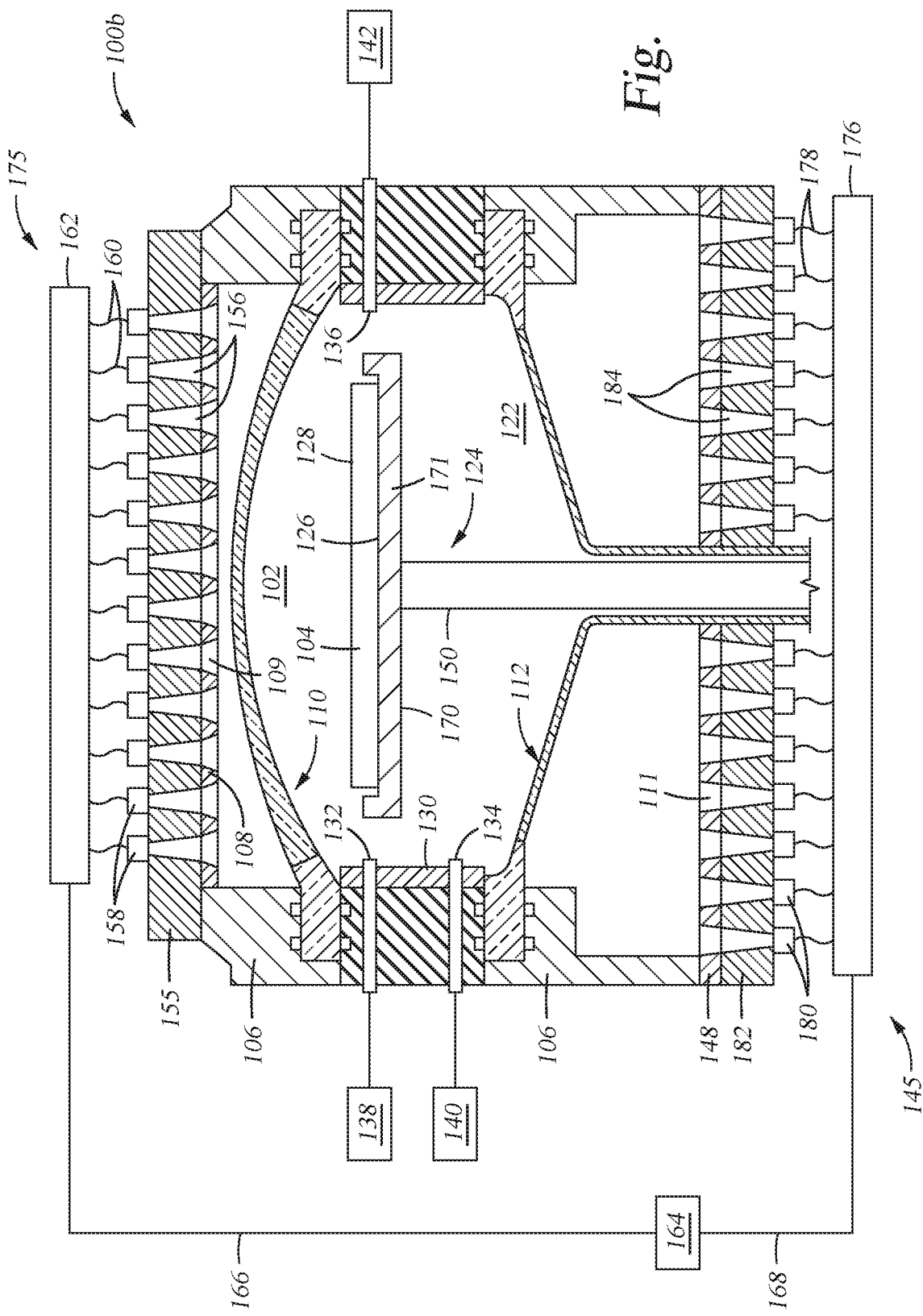

FIGS. 1A-1B illustrate schematic cross-sectional views of processing chambers 100a, 100b according to a first embodiment and a second embodiment described herein. The processing chamber 100a of FIG. 1A includes a chamber body 106, a process gas inlet 132, a gas outlet 136, an upper window 110, a lower window 112, an upper heating device 175, and a substrate support 124. Both the first processing chamber 100a and the second processing chamber 100b have lower heating assemblies. The first processing chamber 100a further includes a lower lamp assembly 144.

The chamber body 106 is an outer body of the first processing chamber 100a. The chamber body 106 surrounds the processing volume 102 and forms the sidewalls of the processing volume 102. The chamber body 106 supports lid 108 and the upper heating device 175 disposed on the lid 108. The chamber body 106 may be al aluminum chamber body. In some embodiments, the chamber body 106 included multiple components. The processing volume 102 is defined by the chamber body 106, the upper window 110, and the lower window 112. The substrate support 124 is disposed within the processing volume 102.

A liner 130 is disposed on the inner surface of the chamber body 106. The liner 130 protects the chamber body 106 from damage and contamination from bi-products of substrate processing. The liner 130 may be an aluminum or aluminum oxide liner and may include a protective coating. The liner 130 is easily removable and is replaced periodically during preventative maintenance.

The process gas inlet 132 and the gas outlet 136 are disposed through the chamber body 106. The process gas inlet 132 fluidly connects a process gas supply 138 and the processing volume 102. The process gas inlet 132 includes multiple gas inlets, such that the process gas inlet 132 includes five or more gas inlets (not shown) equally spaced along a first side of the chamber body 106. Each of the process gas inlets 132 is configured to flow process gases from the process gas supply 138 into the processing volume 102. The process gas supply 138 may be any suitable gas supply capable of supplying the processing volume 102 with a processing gas for substrate processing. Suitable gases include silicon containing precursors, nitrogen containing precursors, and oxygen containing precursors, among others.

The gas outlet 136 is disposed opposite the process gas inlet 132, such that the gas outlet 136 is a gas evacuation outlet 136 and evacuates process gasses from the processing volume 102. The gas outlet 136 is disposed directly across from the process gas inlet 132. The gas outlet 136 may include three or more gas outlets 136. The gas outlet 136 is connected to a pump 142, such as a vacuum pump. The gas outlet 136 fluidly connects the processing volume 102 and the pump 142.

A purge gas inlet 134 is disposed below the process gas inlet 132 and through the chamber body 106. The purge gas inlet 134 fluidly connects the processing volume 102 with a purge gas supply 140. The purge gas inlet 134 is parallel to the processing gas inlet 132. The purge gas inlet 134 is disposed in a plane vertically below the substrate support surface 126 when the substrate support 124 is in a processing position. The purge gas supplied by the purge gas inlet 134 and the purge gas supply 140 may be any suitable purge gas, such as an argon, nitrogen, or helium.

The upper window 110 is disposed above the substrate support 124 and within the chamber body 106. The upper window 110 includes a central window 114 and a peripheral support 118. The central window 114 has a dome shape and bows outward from the processing volume 102 and the substrate support 124. The central window 114 is a quartz dome and is optically transparent, such that radiant energy produced by heating assemblies may pass therethrough. The central window 114 is supported by the peripheral support 118, which is disposed along the outer edge of the central window 114. The peripheral support 118 connects to the central window 114 and may also be a quartz material. The peripheral support 118 is disposed on top of a portion of the chamber body 106, such that the peripheral support 118 is supported by the chamber body 106. While illustrated as a dome, it is contemplated that the upper window 110 may alternatively be planar.

The lower window 112 is disposed below the support body 171 of the substrate support 114 and below the upper window 110. The lower window is located within the chamber body 106 and includes a central window 116 and a peripheral support 120. The central window 116 has a dome shape and bows outward from the processing volume 102 and the substrate support 124. The central window 116 is disposed around the support shaft 150 of the substrate support 124. The central window 116 is a quartz dome and is optically transparent, such that radiant energy produced by heating assemblies may pass therethrough. The central window 116 is supported by the peripheral support 120, which is disposed along the outer edge of the central window 116. The peripheral support 120 connects to the central window 116 and may also be quartz. The peripheral support 120 is disposed on top of a ledge within the chamber body 106, such that the peripheral support 118 is supported by the chamber body 106. While illustrated as a dome, it is contemplated that the lower window 112 may alternatively be planar.

The lower lamp assembly 144 is disposed below the lower window 112. The lower lamp assembly 144 is configured to heat an underside surface 170 of the support body 171 via a plurality of heating lamps 146. The heating lamps 146 may be disposed in a predetermined distribution below the lower window 112. The lower lamp assembly 144 may be disposed above a chamber bottom 148.

The substrate support 124 is disposed within the chamber body 106, such that the substrate support 124 is within the processing volume 102. The substrate support 124 includes a support shaft 150, a support body 171, a substrate support surface 126, and an underside surface 170. The support body 171 is disposed on top of the support shaft 150, The support shaft 150 extends downwards from the underside surface 170 and through an opening in the lower window 112. The substrate support surface 126 is the top surface of the support body 171 and is parallel to the underside surface 170. A substrate 104 may be disposed on the substrate support surface 126.

The upper heating device 175 includes an upper cooling plate 155, one or more upper base members 158 disposed on the upper cooling plate 155, one or more upper light sources 162, and one or more optical fibers 160 connected to the one or more upper light sources 162 and the one or more upper base members 158. The upper heating device 175 is disposed on top of the lid 108 and above the upper window 110. The upper heating device 175 is configured to heat the top surface 128 of the substrate 104.

In the first processing chamber 100a, there are ten or more openings 156 through the upper cooling plate 155. Each of the ten or more openings 156 includes sidewall disposed at an acute angle relative to vertical. The lid 108 includes a plurality of lid openings 109. The plurality of lid openings 109 align with the openings 156 formed through the upper cooling plate 155. An upper base member 158 is disposed adjacent to each of the openings 156. Each of the one or more upper base members 158 has one optical fiber 160 connected thereto. Each of the optical fibers 160 are connected to one or more upper light sources 162. The one or more upper light sources 162 may be inside of a containment block. The one or more upper light sources 162 projects a laser through the optical fibers 160 and through the openings 156 within the upper cooling plate 155. The lasers diverge after leaving the optical fibers 160 and are projected onto the top surface 128 of the substrate 104. The upper heating device 175 provides controlled heating to the substrate 104 and can be used in place of heating lamps, such as those used in the lower lamp assembly 144.

A controller 164 is connected to both of the lower lamp assembly 144 and the upper heating device 175. The controller 164 controls the settings of each of the upper light sources 162 and the heating lamps 146. The controller 164 supplies power to each of the lower lamp assembly 144 and the upper heating device 175, The controller 164 may receive input from one or more sensors (not shown) utilized to measure the temperature of the substrate 104 and may adjust the settings of either of the lower lamp assembly 144 or the upper heating device 175 accordingly, FIG. 1B is a schematic cross-sectional view of the second processing chamber 100b. The second processing chamber 100b is similar to the first processing chamber 100a, but includes a lower heating device 145 rather than a lower lamp assembly 144.

The lower heating device 145 includes a lower cooling plate 182, one or more lower base members 180 disposed on the lower cooling plate 182, one or more lower light sources 176, and one or more optical fibers 178 connected to the one or more lower light sources 176 and the one or more lower base members 180. The lower heating device 145 is disposed below the chamber bottom 148 and below the lower window 112. The lower heating device 145 is configured to heat the support chuck underside surface 170.

In the second processing chamber 100b, there are ten or more openings 156 through the upper cooling plate 155 and ten or more openings 184 through the lower cooling plate 182. Each of the ten or more openings 184 is a slanted opening, such that the openings 184 include a sidewall disposed at an acute angle relative to vertical. The ten or more openings 184 through the lower cooling plate 182 are similar to the ten or more openings 156 described with respect to FIG. 1A. The chamber bottom 148 includes a plurality of bottom openings 111. The plurality of bottom openings 111 align with the openings 184 formed through the lower cooling plate 182. A lower base member 180 is disposed adjacent to each of the openings 184, Each of the one or more lower base members 180 has one optical fiber 178 connected thereto. Each of the optical fibers 178 may be connected to one or more lower light sources 176. The one or more lower light sources 176 may be inside of a containment block. The one or more lower light sources 176 projects a laser through the optical fibers 178 and through the openings 184 within the lower cooling plate 182. The lasers diverge after leaving the optical fibers 178 and are projected onto the support chuck underside surface 170 of the support body 171. The lower heating device 145 provides controlled heating to the support chuck underside surface 170 and can be used in place of heating lamps, such as those used in the lower lamp assembly 144.

The controller 164 is connected to both of the upper heating device 175 and the lower heating device 145. The controller 164 controls the settings of each of the upper light sources 162 and the lower light sources 176. The controller 164 may supply power to each of the lower heating device 145 and the upper heating device 175. The controller 164 may receive input from one or more sensors (not shown) utilized to measure the temperature of the substrate 104 and may adjust the settings of either of the lower lamp assembly 144 or the upper heating device 175 accordingly, Without the utilization of a lamp assembly within the second processing chamber 100b, a pyrometer (not shown) may be utilized to measure the temperature of the substrate 104.

Figure 2A:
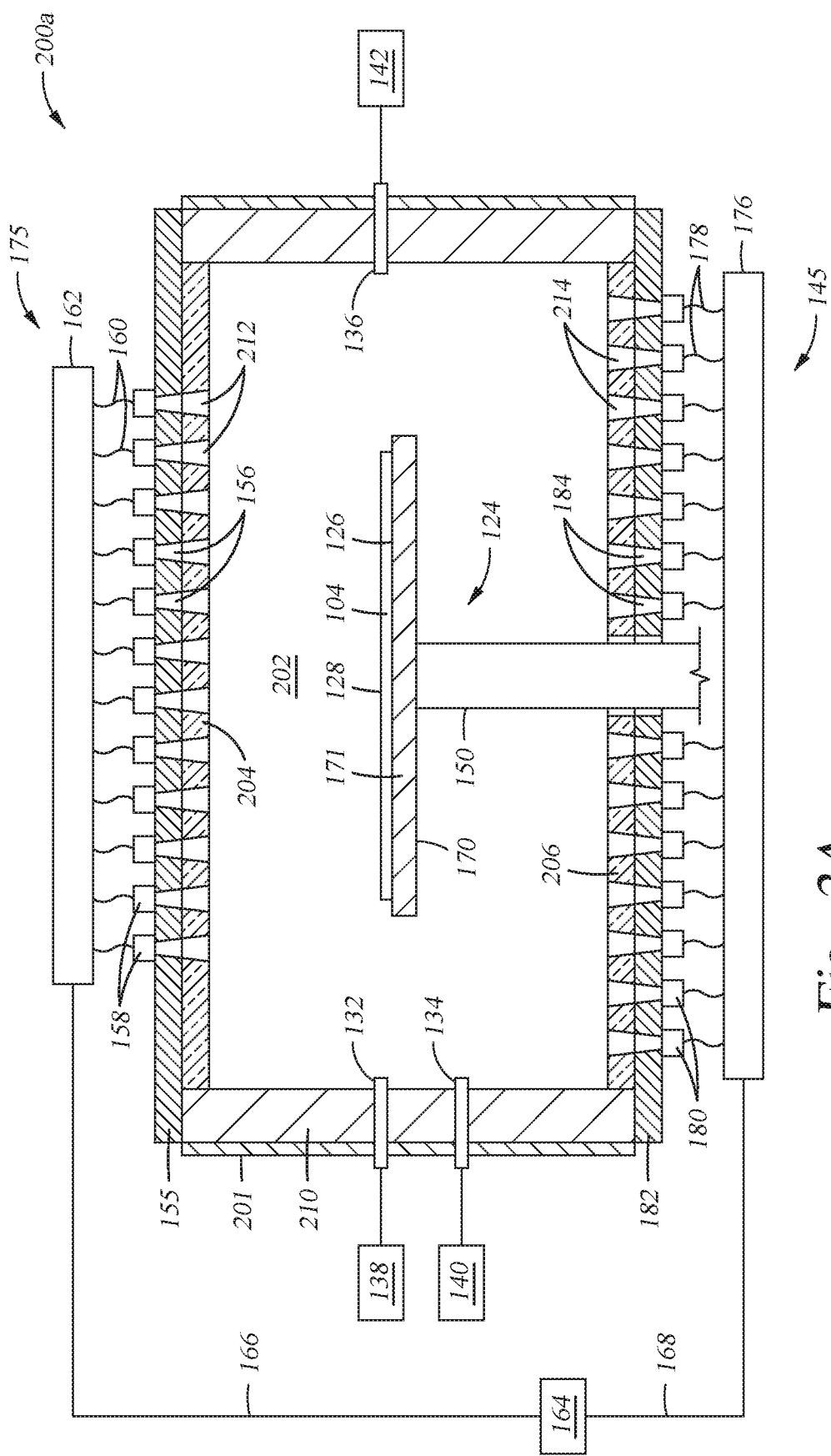
FIGS. 2A-2B illustrate schematic cross-sectional views of a processing chamber according to a third embodiment and a fourth embodiment described herein.
Figure 2B:
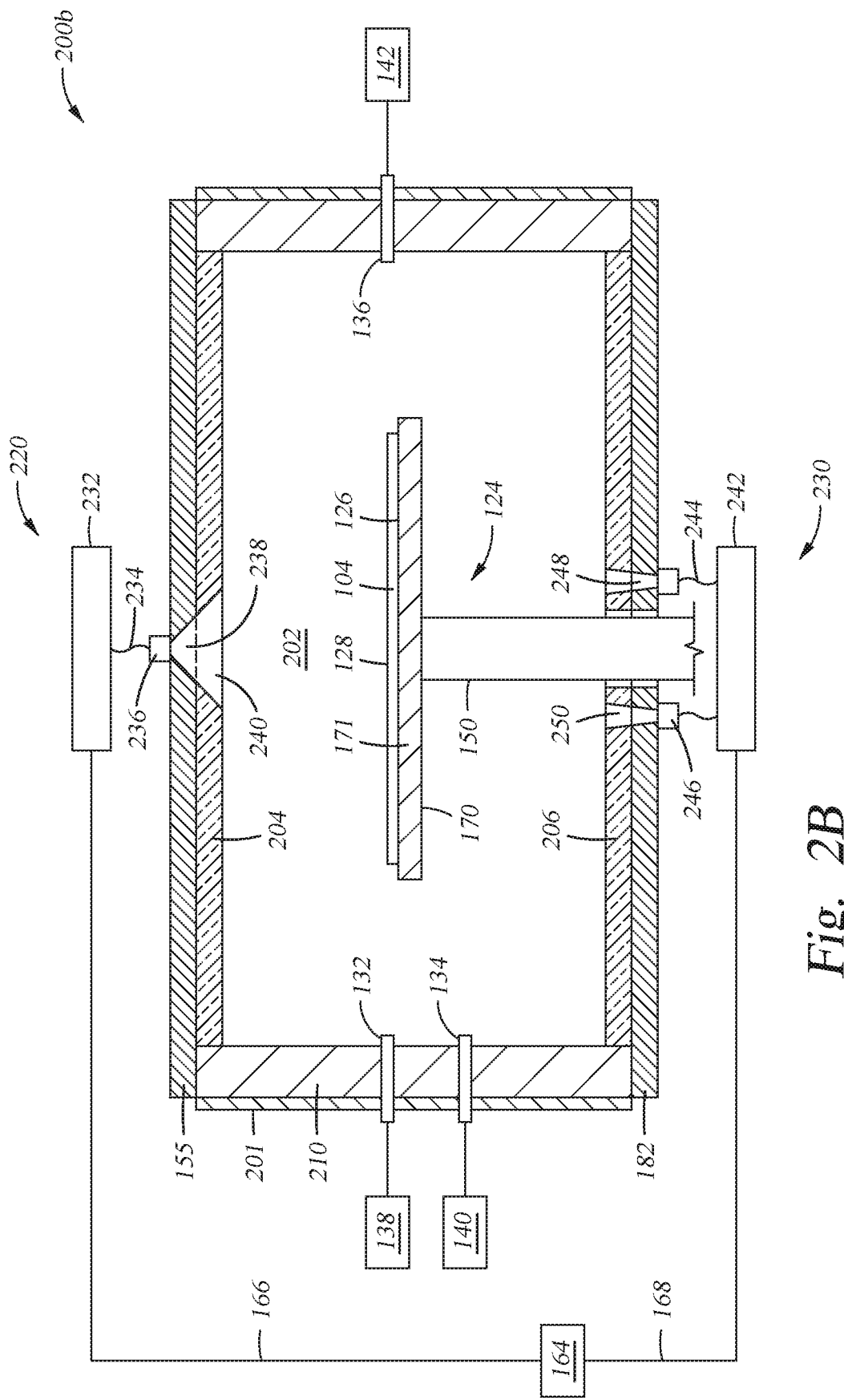

FIGS. 2A-2B illustrate schematic cross-sectional views of processing chambers 200a, 200b according to a third embodiment and a fourth embodiment described herein. The processing chamber 200a is a thermal processing chamber. The processing chamber 200a includes a chamber body 201, a gas inlet 132, a gas outlet 142, a substrate support 124, an upper window 204, a lower window 206, an upper heating device 175, a lower heating device 145, and a controller 164. The gas inlet 132, the gas outlet 142, the substrate support 124, the upper heating device 175, the lower heating device 145, and the controller 164 are similar to that described above with regard to FIGS. 1A and 1B.

The chamber body 201 surrounds the processing volume 202. The chamber body 201 encloses at least part of the processing volume 202 and has at least two openings for heating systems to be equipped thereto. The upper heating device 175 covers a first opening, such as a top opening, of the chamber body 201 and the lower heating device 145 covers a second opening, such as a bottom opening, of the chamber body 201. The chamber body 201 includes a process gas inlet 132, a purge gas inlet 134, and a gas outlet 136 disposed therethrough. The process gas inlet 132 and the purge gas inlet 134 are disposed along a first side of the chamber body 201. The gas outlet 136 is disposed opposite the process gas inlet 132 and the purge gas inlet 134, such that the gas outlet 136 is at about a 180 degree angle with the process gas inlet 132 and/or the purge gas inlet 134 and is disposed along a second side of the chamber body 201.

A chamber side liner 210 is disposed on the inner side surface of the chamber body 201. The chamber side liner 210 covers the inside surface of the chamber body 201 and protects the chamber body 201 from damage caused by the heating of the substrate 104 using the upper heating device 175 and the lower heating device 145. The chamber side liner 210 is a quartz liner, such as an opaque quartz liner. The opaqueness of the chamber side liner 210 allows for the radiant energy dispersed throughout the chamber body 201 to be absorbed by the chamber side liner 210 before striking the chamber body 201, The chamber side liner 210 may act as a heat sink within the chamber body 201, such that the chamber side liner 210 absorbs radiant energy and assists in maintaining a constant temperature within the processing volume 202.

The upper window 204 is disposed adjacent to the upper heating device 175, such that the upper window 204 is disposed along a bottom surface of upper cooling plate 155 of the upper heating device 175 opposite the upper base members 158. The upper window 204 is a flat window and is made of quartz. The upper window 204 is quartz with a reflective coating on a lower surface thereof, such that radiant energy which impacts the upper window 204 is reflected. The use of reflective quartz material protects the upper cooling plate 155 from process gasses and radiant energy within the processing volume 202. The reflective coating of the upper window 204 may be a multi-layer dielectric coating, such as a gold layer with a protective oxide or nitride layer formed thereon. The reflective coating may also be a modified quartz material, which has been enhanced to improve reflectivity. The reflective coating is used to enhance reflection in the infrared range. The upper window 204 includes a plurality of window openings 212 disposed therein. The window openings 212 are aligned with each of the openings 156 of the upper cooling plate 155. The number of window openings 212 equals the number of openings 156 of the upper cooling plate 155. The openings 156 and the window openings 212 are arranged to deliver lasers from the upper heating device 175 onto the substrate 104. The openings 156 and the window openings 212 may be arranged in a concentric circle, an array, or a spiral pattern.

The lower window 206 is disposed adjacent to the lower heating device 145, such that the lower window 206 is disposed along a top surface of lower cooling plate 182 of the lower heating device 145 opposite the lower base members 180. The lower window 206 is a flat window and may me made of quartz. The lower window 206 is quartz with a reflective coating on a lower surface thereof, such that radiant energy which impacts the lower window 206 is reflected. The use of reflective quartz material protects the lower cooling plate 182 from process gasses and radiant energy within the processing volume 202. The reflective coating of the lower window 206 may be a multi-layer dielectric coating, such as a gold layer with a protective oxide or nitride layer formed thereon. The reflective coating may also be a modified quartz material, which has been enhanced to improve reflectivity. The reflective coating is used to enhance reflection in the infrared range. The lower window 206 includes a plurality of window openings 214 disposed therein. The window openings 214 are aligned with each of the openings 184 of the lower cooling plate 182. The number of window openings 214 equals the number of openings 184 of the lower cooling plate 182.

The processing chamber 200a is greatly simplified from the second processing chamber 100b of FIG. 1B. The processing chamber 200a has a planar upper cooling plate 155 and upper window 204 as well as a planar lower cooling plate 182 and lower window 206. The planarity of the upper cooling plate 155, the upper window 204, the lower cooling plate 182, and the lower window 206 allows for a reduction in chamber size and a reduced overall footprint.

FIG. 2B illustrates a processing chamber 200b. The processing chamber 200b is similar to the processing chamber 200a of FIG. 2A, but the upper heating device 220 and the lower heating device 230 replace the upper heating device 175 and the lower heating device 145. The upper window 204 and the lower window 206 are modified, such that the upper window openings 240 and the lower window openings 250 are aligned with the openings 238 and the openings 248 respectively.

The upper heating device 220 includes an upper cooling plate 155, one or more upper base members 236 disposed on the upper cooling plate 155, one or more upper light sources 232, and one or more optical fibers 234 connected to the one or more upper light sources 232 and the one or more upper base members 236. The upper heating device 220 is disposed on top of the upper window 204. The upper heating device 220 is configured to heat the top surface 128 of the substrate 104.

In the processing chamber 200b, there are one or more openings 238 through the upper cooling plate 155. In the embodiment shown in FIG. 2B, there is one opening 238 formed through the upper cooling plate 155. The one opening 238 is centered above the substrate 104 and is centered above the substrate support surface 126 of the substrate support 124. Each of the openings 238 is a slanted opening, such that the openings 238 include a sidewall disposed at an acute angle relative to vertical. An upper base member 236 is disposed adjacent to each of the openings 238. Each of the one or more upper base members 236 has one optical fiber 234 connected thereto. Each of the optical fibers 234 is connected to one or more upper light sources 232. The one or more upper light sources 232 may be inside of a containment block. The one or more upper light sources 232 project a laser through the optical fiber 234 and through the opening 238 within the upper cooling plate 155. The lasers diverge after leaving the optical fibers 234 and are projected onto the top surface 128 of the substrate 104.

The lower heating device 230 includes a lower cooling plate 182, one or more lower base members 246 disposed on the lower cooling plate 182, one or more lower light sources 242, and one or more optical fibers 244 connected to the one or more lower light sources 242 and the one or more lower base members 246. The lower heating device 230 is disposed below the lower window 206. The lower heating device 230 is configured to heat the substrate support 170 and/or the substrate 104 positioned.

In the processing chamber 200b, there are one or more openings 248 through the lower cooling plate 182. Each of the one or more openings 248 is a slanted opening such that the openings 248 include a sidewall disposed at an acute angle relative to vertical. The one or more openings 248 through the lower cooling plate 182 are similar to the openings 184 described with respect to FIG. 1B. In some embodiments, the one or more openings 248 includes two openings through the lower cooling plate 182. Each of the two openings may be horizontally offset from the center of the substrate support surface 126, such that each of the two openings 248 are on opposite sides of the support shaft 150 of the substrate support 124. In other embodiments, there may be a single opening, such as one opening, through the lower cooling plate 182, such that a single opening is horizontally offset from the center of the substrate support surface 126. The single opening may include a lens assembly, which enables the offset single opening to project a uniform ring of radiant energy onto the support chuck underside surface 170 of the support body 171, wherein the uniform ring of radiant energy is centered around the support shaft 150.

A lower base member 246 is disposed adjacent to each of the openings 248. Each of the one or more lower base members 246 has one optical fiber 244 connected thereto. Each of the optical fibers 244 may be connected to one or more lower light sources 242. The one or more lower light sources 242 may be inside of a containment block. The one or more lower light sources 242 project a laser through the optical fibers 244 and through the openings 248 within the lower cooling plate 182. The laser diverges after leaving the optical fibers 244 and is projected onto the support chuck underside surface 170 of the support body 171. The lower heating device 242 provides controlled heating to the support chuck underside surface 170 and can be used in place of heating lamps, such as those used in the lower lamp assembly 144.

The upper window 204 is disposed adjacent to the upper heating device 220, such that the upper window 204 is disposed along a bottom surface of the upper heating device 175 opposite the upper base members 158. The upper window 204 covers the top of the processing chamber 200b, and is part of an overall lid assembly. The upper window 204 is a similar material to the upper window 204 described in FIG. 2A. The upper window 204 includes at least one window opening 240 disposed therein. The window opening 240 is aligned with the opening 238 of the upper cooling plate 155. The number of window openings 240 equals the number of openings 238 of the upper cooling plate 155.

The lower window 206 is disposed adjacent to the lower heating device 230, such that the lower window 206 is disposed along a top surface of lower cooling plate 182 of the lower heating device 230 opposite the lower base members 246. The lower window 206 is a flat window and may be similar in material to the lower window 206 of FIG. 2A. The lower window 206 includes a one or more window openings 250 disposed therein. The window openings 250 are aligned with each of the openings 248 of the lower cooling plate 182. The number of window openings 250 equals the number of openings 248 of the lower cooling plate 182, In some embodiments, only one opening 248 is formed through the cooling plate 182 and one lower base member 246 is adjacent the opening 248. In this embodiment, the lower window 206 includes one window opening 250 adjacent to the opening 248. In some embodiments, two openings 248 are formed through the cooling plate 182 and there are two window openings 250 formed adjacent to and aligned with the two openings 248.

The processing chamber 200b is greatly simplified from the second processing chamber 100b of FIG. 1B. The processing chamber 200b has a planar upper cooling plate 155 and upper window 204 as well as a planar lower cooling plate 182 and lower window 206. The planarity of the upper cooling plate 155, the upper window 204, the lower cooling plate 182, and the lower window 206 allows for a reduction in chamber size and a reduced overall footprint.

FIG. 3 illustrates a schematic cross-sectional view of a laser assembly 300 similar to that found in any of FIG. 1A-1B or 2A-2B. The laser assembly 300 includes a portion of the upper cooling plate 155, a portion of the upper window 204, an upper base member 158, an optical fiber 160, a light source 162, and an irradiation window 308. The upper cooling plate 155, the upper window 204, the upper base member 158, the optical fiber 160, and the light source 162 are described above. The laser assembly 300 is similar to any of the laser assemblies utilized in the upper heating devices 175, 220 and the lower heating devices 145, 230 and may be used in place thereof. The elements of the laser assembly 300 may be incorporated into and of the upper heating devices 175, 220, or the lower heating devices, 145, 230.

The upper cooling plate 155 includes an upper surface 332 and a lower surface 334. Both of the upper surface 332 and the lower surface 334 are planar surfaces. The upper surface 332 is opposite the lower surface 334. The upper cooling plate 155 includes cooling channels 306 disposed therein. The cooling channels 306 are formed through the upper cooling plate 155 and may be used to circulate water or other cooling fluids through the upper cooling plate 155, The cooling channels 306 may be arranged in any suitable manner and are configured to maintain the upper cooling plate 155 at a temperature less than about 250° C. such as less than about 200° C., such as less than about 150° C., such as less than 100° C. In some embodiments, the temperature of the upper cooling plate 155 is about 25° C. to about 100° C., such as about 25° C. to about 70° C. The top surface of the upper cooling plate 155 is generally cooler than the bottom surface of the upper cooling plate 155. The upper cooling plate 155 comprises a metal material, such as an aluminum material or a stainless steel with nickel plating. The upper cooling plate 155 could also comprise a copper material. Other corrosion resistant alloys with high thermal conductance may also be utilized.

In some embodiments, the cooling channels 306 are pipes disposed on the upper surface 332 of the upper cooling plate 155 and the upper cooling plate 155, and therefore are not disposed through the upper cooling plate 155 itself. The upper cooling plate 155 has at least one o-ring groove 312 disposed within the upper surface 332 of the upper cooling plate 155. The o-ring groove 312 is circular and formed beneath the irradiation window 308. An o-ring, or other seal, is disposed in the o-ring groove 312 to facilitate formation of a fluid-tight vacuum seal.

The opening 156 formed through the upper cooling plate 155 is a conical frustum, such that the opening 156 is a partial cone shape. The opening 156 is narrower at the upper surface 332 of the upper cooling plate 155 and wider at the lower surface 334 of the upper cooling plate 155. In embodiments in which optical elements are disposed between the optical fiber 160 and the opening 156, the diameter of the opening 156 at the upper surface 332 is about 0.1 mm to about 15 mm, such as about 1 mm to about 10 mm, such as about 2 mm to about 7 mm. The diameter of the opening 156 at the lower surface 334 while optical elements are disposed between the optical fiber 160 and the opening 156 is about 2 mm to about 25 mm, such as about 5 mm to about 20 mm. In embodiments in which a fiber laser is utilized as optical fiber 160, the diameter of the opening 156 at the upper surface 332 is about 10 μm to about 200 μm, such as about 50 μm to about 150 μm, such as about 100 μm. In embodiments in which the fiber laser is utilized as the optical fiber 160, the diameter of the opening 156 at the lower surface 334 is about 50 μm to about 250 μm, such as about 75 μm to about 150 μm, such as about 100 μm. The cooling plate opening walls 302 may be angled at an angle of about 45 degrees to 85 degrees with respect to the lower surface 334 of the upper cooling plate 155, such as an angle of about 5 degrees to about 55 degrees, such as about 5 degrees to about 45 degrees, such as about 10 degree to about 35 degrees with respect to a vertical passing through the openings 156 and perpendicular to the lower surface 334 of the upper cooling plate 155.

The upper window 204 is disposed adjacent to the lower surface 334 of the upper cooling plate 155. The upper window 204 includes a top surface 336 and a bottom surface 338. The top surface 336 and the bottom surface 338 are planar surfaces and are parallel to one another. The top surface 336 of the upper window 204 contacts the lower surface 334 of the upper cooling plate 155. The upper window 204 includes a window opening 212 disposed therethrough. The window opening 212 is aligned with the opening 156 through the upper cooling plate 155.

The window opening 212 is a conical frustum, such that the opening 156 is a partial cone shape. The window opening 212 is narrower at the top surface 336 of the upper window 204 and wider at the bottom surface 338 of the upper window 204. The diameter of the window opening 212 at the top surface 336 is equal to the diameter of the opening 156 at the lower surface 334 of the upper cooling plate 155. The diameter of the window opening 212 at the bottom surface 338 is about 0.1 mm to about 20 mm, such as about 2 mm to about 20 mm, such as about 5 mm to about 10 mm. The window opening walls 304 may be angled at an angle of about 45 degrees to 85 degrees with respect to the lower surface 338 of the upper window 204, such as an angle of about 55 degrees to about 80 degrees with respect to the lower surface 338 of the upper window 204. The angle of the window opening walls 304 is equal to the angle of the cooling plate opening walls 302.

The material of the upper window 204 is a quartz material. In some embodiments, the upper window 204 is a reflective quartz material. The reflective quartz material may reflect greater than 40% of the radiant energy which strikes the upper window 204, such as greater than 50% of the radiant energy, such as greater than 60% of the radiant energy. The upper window 204 has a thickness 330 of about 1 mm to about 30 mm, such as about 2 mm to about 25 mm, such as about 5 mm to about 20 mm.

The upper base member 158 may be a cylindrical component. The upper base member 158 may be a laser head holder, a screw attachment, or any other apparatus for holding the optical fiber 160 adjacent to the upper cooling plate 155. The upper base member 158 is made of an aluminum, stainless steel, or copper material. In some embodiments, the upper base member 158 is made from the same material as the upper cooling plate 155. Using similar materials allows for similar thermal expansion. The upper base member 158 is disposed on the upper surface 332 of the upper cooling plate 155. The upper base member 158 includes the irradiation window 308 disposed therein. The upper base member 158 further comprises at least part of one end of the optical fiber 160 disposed therein. The upper base member 158 includes a central passage 350 disposed therein. The central passage 350 is a vertical passage, which passes through the center of the upper base member 158. The irradiation window 308 and at least part of the optical fiber 160 are disposed within the central passage 350.

The upper base member 158 further includes an o-ring groove 310 disposed therein. The o-ring groove 310 is disposed adjacent to the irradiation window 308. The o-ring groove 310 is sized to receive an o-ring, or other seal, and may be disposed opposite the o-ring groove 312 of the upper cooling plate 155. The irradiation window 308 is disposed between the o-ring groove 312 of the upper cooling plate 155 and the o-ring groove 310 of the upper base member 158. The upper base member 158 is fastened to the upper surface 332 of the upper cooling plate 155. The upper base member 158 may be fastened to the upper surface 332 by an adhesive, such as glue, or a fastener, such as a bolt.

The optical fiber 160 is used to transport the laser irradiation from the light source 162 to the upper base member 158 and the irradiation window 308. The optical fiber 160 includes an inner fiber 340 and an outer cladding 344. The inner fiber 340 is a fiber-optic cable used to transport the laser irradiation. The outer cladding 344 is a cladding disposed around the inner fiber 340 to protect the inner fiber 340. The outer diameter 342 of the inner fiber 340 is about 300 μm to about 1000 μm, such as about 400 μm to about 900 μm, such as about 500 μm to about 800 μm. In some embodiments, the outer diameter of the inner fiber 340 is about 600 μm. In some embodiments, the outer diameter 320 of the outer cladding 344 is about 5 mm to about 12 mm, such as about 6 mm to about 10 mm, such as about 8 mm. The optical fiber 160 may have near complete internal reflection, such that all light within the optical fiber 160 is completely reflected and does not escape along the length of the optical fiber 160.

The laser 322 is output from the end of the optical fiber 160. The laser 322 may be a divergent laser. The laser 322 is an infrared laser or a visible light laser, outputting radiant energy having a wavelength between about 400 nanometers (nm) to 1 millimeter (mm), such as about 400 nm to about 1700 nm, such as about 400 nm to about 1100 nm, for example about 700 nm to about 1100 nm. The laser 322 outputs a beam with a power of about 10 W to about 10,000 W, such as about 100 W to about 5,000 W, such as about 200 W to about 1,000 W. The laser 322 is directed towards the irradiation window 308. The laser 322 is manipulated by optical components within the irradiation window 308 and is output as a conical beam 324 with an upper diameter 316 of about 2 mm to about 10 mm, such as about 4 mm to about 7 mm. The conical beam 324 is divergent and expands as the conical beam 324 approaches the top surface 128 of the substrate 104. The conical beam 324 expands and has a bottom diameter 318 of about 50 mm to about 100 mm, such as about 70 mm to about 80 mm at the top surface 128 of the substrate 104. The conical beam 324 travels a vertical distance 314 of about 50 mm to about 150 mm, such as about 75 mm to about 125 mm from the irradiation window 308 to the top surface 128 of the substrate 104. The ratio of vertical distance 314 traveled to bottom diameter 318 is about 2:1 to about 1:1.5, such as about 1.5:1 to about 1:1.

In the embodiment described herein, the optical fiber 160 and the irradiation window 308 are configured such that less than 1%, such as less than about 0.5%, such as less than about 0.25%, such as less than about 0.15% of the energy emitted by the optical fiber 160 is absorbed by the window, the upper base member 158, or the optical fiber 160 itself after being emitted by the optical fiber 160. In some embodiments, the irradiation window 308 absorbs about 1.6 W of power from the laser 322 before emitting the laser 322 as the conical beam 324.

The light source 162 may be a single laser diode or a plurality of laser diodes. In embodiments in which the light source 162 is a single laser diode, the light source 162 is a high-powered laser diode and may be split using optical components to flow through each of the optical fibers 160. In embodiments in which multiple light sources 162 are utilized, the light source 162 is directly coupled to a single optical fiber 160. In some embodiments, the number of light sources 162 equals the number of openings 156 formed through the upper cooling plate 155, such as ten or more light sources 162.

The irradiation window 308 is an optical component or includes one or more optical components disposed therein. The irradiation window 308 is configured to diverge the laser 322 and form the conical beam 324. The irradiation window 308 may be or may include a lens such as a divergent lens or a co-axial lens. In some embodiments, the irradiation window 308 may form a single or a plurality of ring-shaped beams The laser 322 and the conical beam 324 include infrared radiation (IR) or visible radiation and in some embodiments have a wavelength of about 1 um or greater. The wavelength of the laser 322 is described in greater detail herein.

Each of the upper heating device 220, the lower heating device 145, and the lower heating device 230 include elements such as those described with relation to FIG. 3. In embodiments in which the laser assemblies 300 of the lower heating device 145 and the lower heating device 230 are described, each of the upper/top and lower/bottom descriptors may be reversed.

Figure 4A:
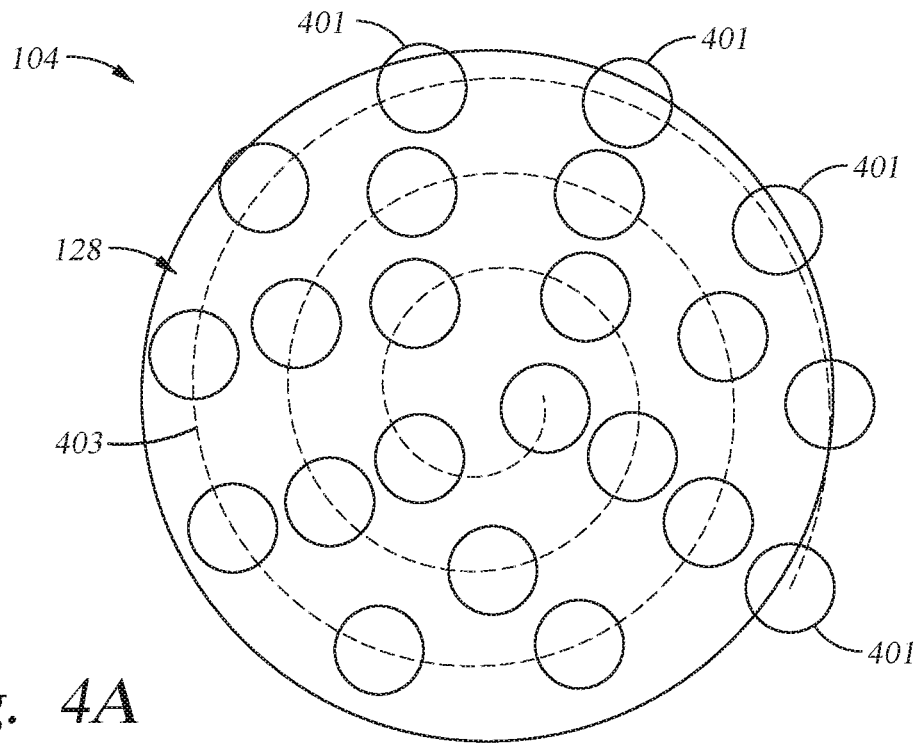
FIG. 4A is a schematic plan view of a heating distribution on a substrate according to a first embodiment.

FIG. 4A is a schematic plan view of a heating distribution on the top surface 128 of the substrate 104 according to a first embodiment. The heating distribution includes a plurality of hot spots 401. The hot spots 401 are formed by the conical beam 324 emitted by the laser assembly 300, such that a single conical beam 324 forms each of the hot spots 401 of the plurality of hot spots 401. The hot spots 401 of FIG. 4A are shown in a spiral pattern 403. The spiral pattern 403 may further be described as a coil. The hot spots 401 formed by each of the conical beams 324 may reach a temperature of about 800° C. to about 1500° C., such as about 900° C. to about 1300° C., such as about 1000° C. to about 1200° C.

There may be greater than 10 laser assemblies 300 and hot spots 401, such as greater than 15 laser assemblies 300 and hot spots 401, such as greater than 20 laser assemblies 300 and hot spots 401. Each of the hot spots 401 may overlap with other hot spots 401. The hot spots 401 shown in FIG. 4A are meant to be illustrative. The hot spots 401 may be greater than about 50 mm in diameter, such as greater than about 60 mm in diameter, such as about 50 mm to about 100 mm in diameter, such as about 60 mm to about 80 mm. In one example, the hot spots 401 are positioned at different radial distances from a center of the substrate 104, such that when the substrate 104 is rotated, uniform heating of the substrate 104 is achieved. In such an example, the radial distances of the hot spots 401 may overlap, although the hotspots 401 may be angularly offset from one another.

Figure 4B:
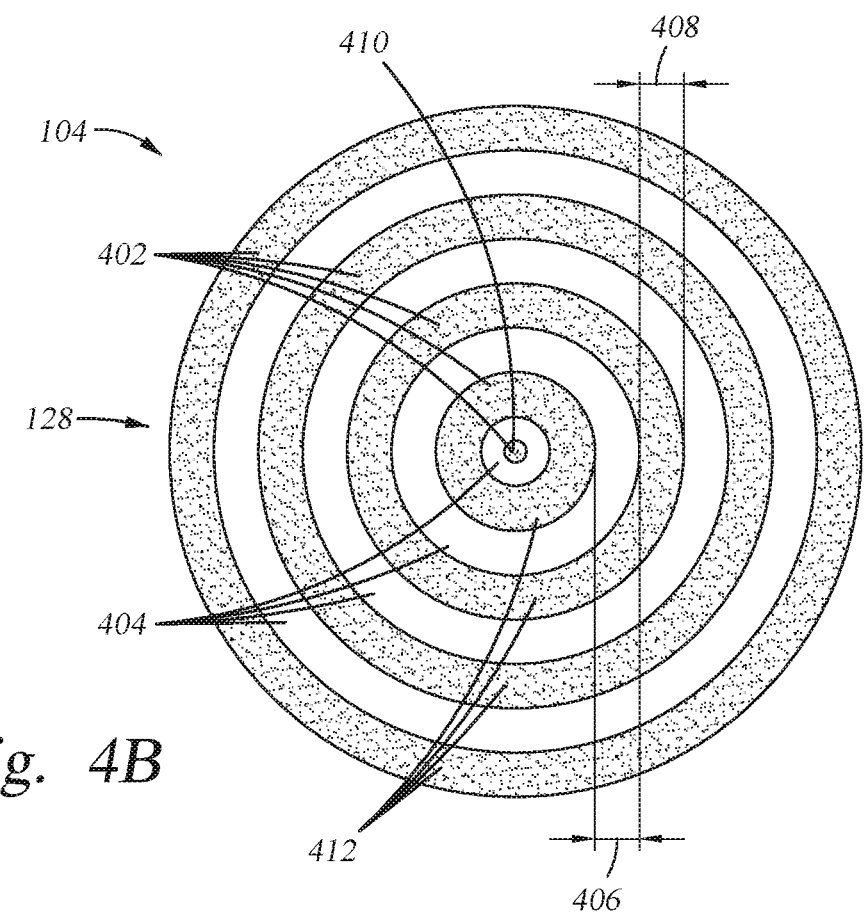
FIG. 4B is a schematic plan view of a heating distribution on a substrate according to a second embodiment.

FIG. 4B is a schematic plan view of a heating distribution on a substrate 104 according to a second embodiment. The second embodiment of the heating distribution along the top surface 128 of the substrate 104 includes a plurality of concentric heated zones 402. The concentric heated zones 402 includes a central zone 410 and a plurality of annular zones 412. There may be annular gaps 404 between the heated zones 402. The annular gaps 404 may be adjusted in size by altering the thickness 408 of each of the heated zones 402. The thickness 408 of the heated zones 402 is adjusted in some embodiments, such that there are no annular gaps 404 and the entire top surface 128 of the substrate 104 is covered in heated zones 402.

In some embodiments there may be seven or more heated zones 402, such as 10 or more heated zones 402, such as 14 or more heated zones. The diameter of the central zone 410 may be the same as the thickness 408 of each of the annular zones 412. The thickness 408 of each of the annular zones 412 may be about 5 mm to about 50 mm, such as about 10 mm to about 40 mm. The thickness 406 of the annular gaps 402 may be about 0 mm, such that the thickness 406 of the annular gaps 402 is negligible.

Each of the heating zones 402 may be formed by a single laser assembly 300 or all of the heating zones 402 may be formed by a single laser assembly 300. In embodiments in which each of the heating zones 402 is formed by a single laser assembly 300, at least one laser assembly 300 is horizontally offset from the center of the top surface 128 of the substrate 104. In embodiments in which as single laser assembly 300 creates all of the heating zones 402 a single laser assembly 300 may be utilized. The single laser assembly 300 may include one or more coaxial lenses within the irradiation window.

Figure 5A:
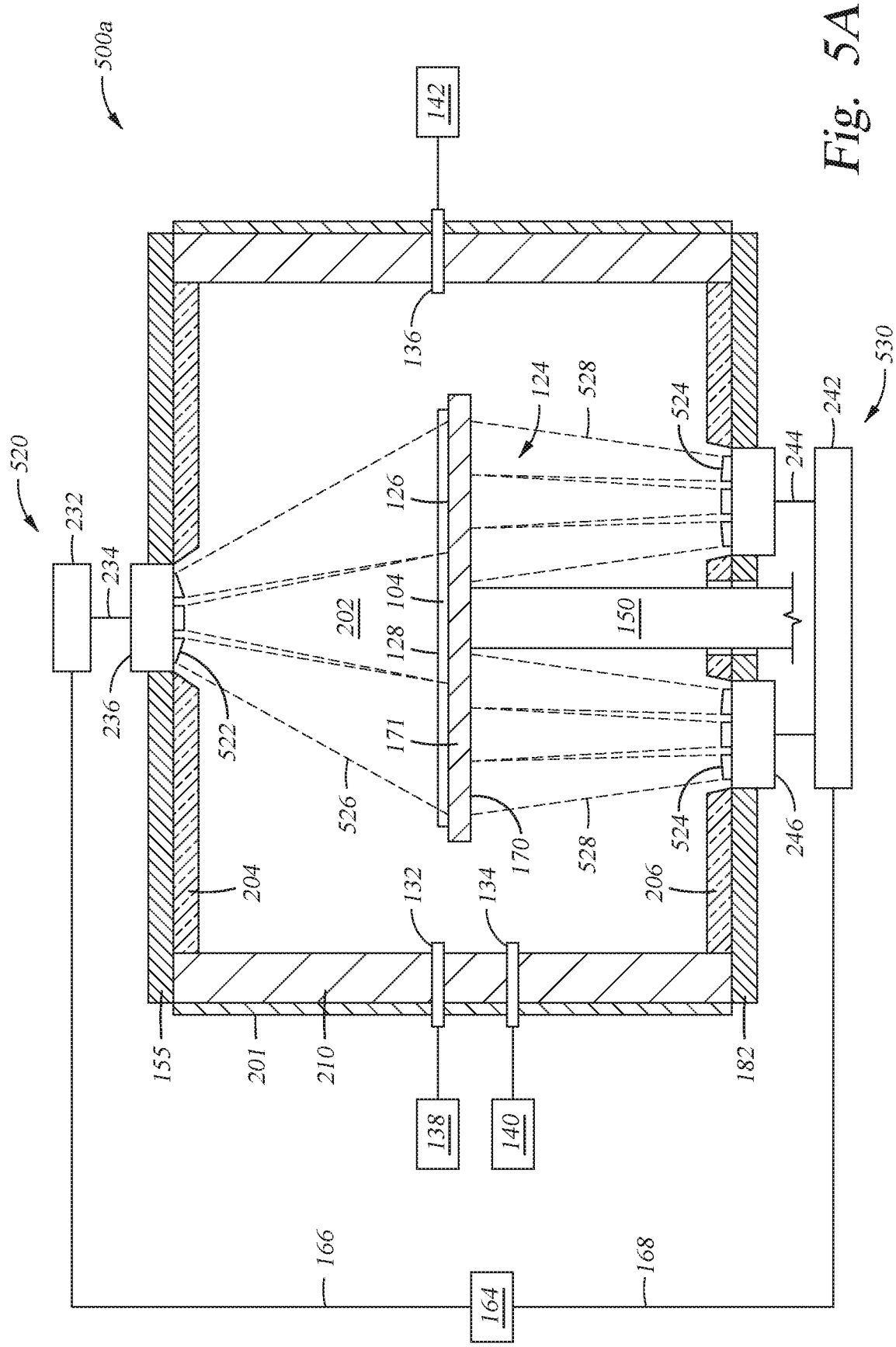
FIGS. 5A-5C illustrate schematic cross-sectional views of processing chambers according to a fifth embodiment, a sixth embodiment, and a seventh embodiment.
Figure 5B:
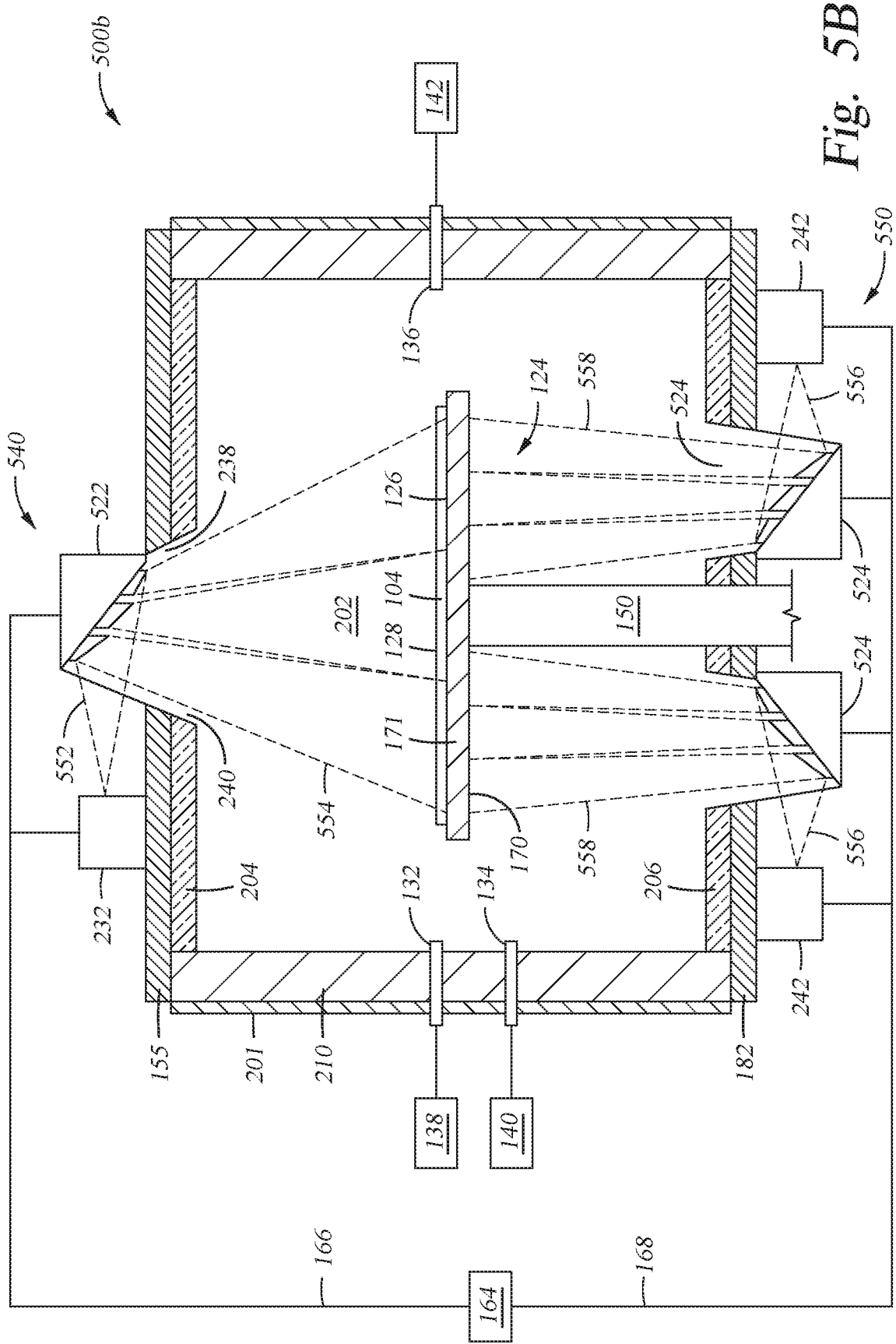
Figure 5C:
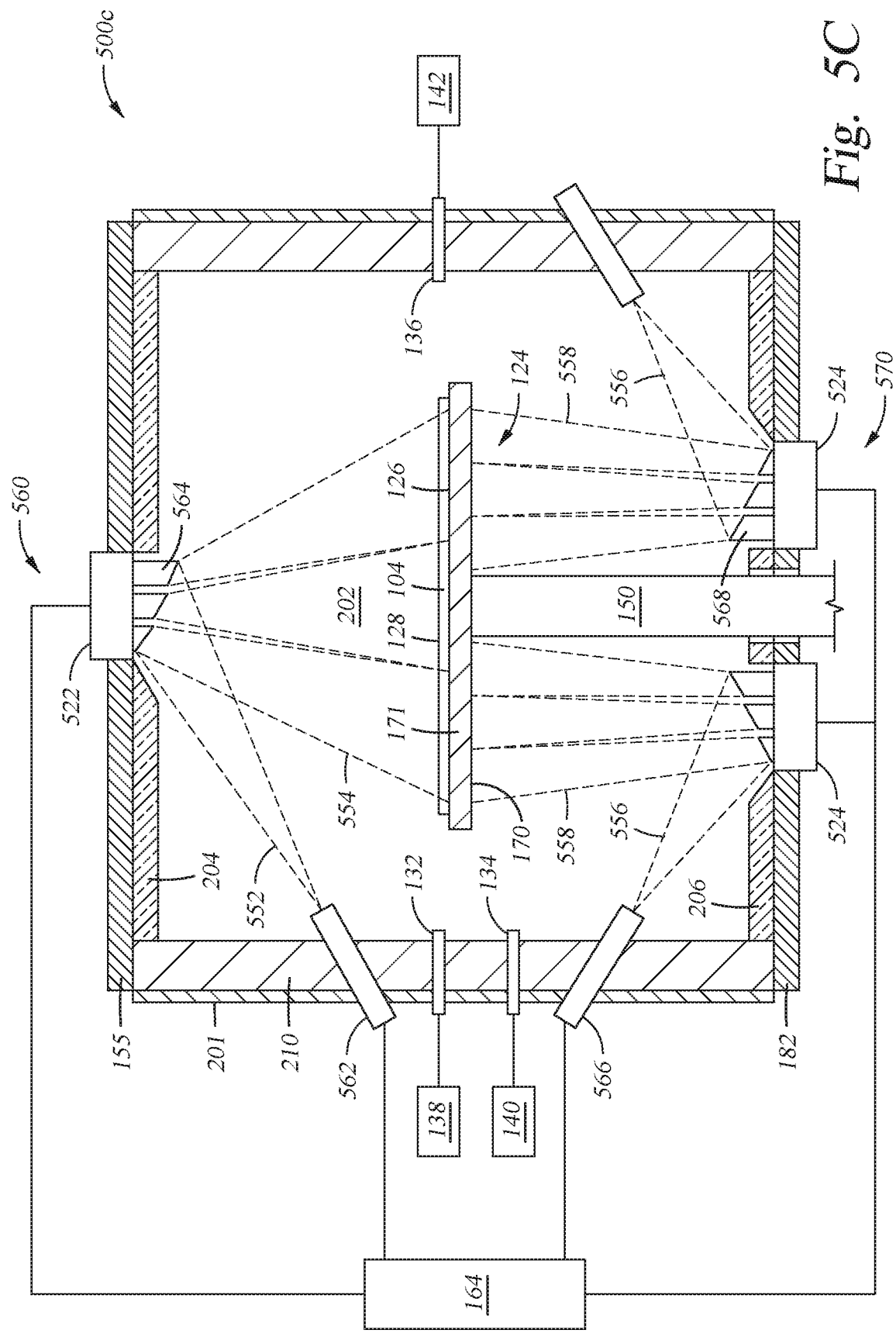

FIGS. 5A-5C illustrate schematic cross-sectional views of processing chambers 500a, 500b, 500c according to a fifth embodiment, a sixth embodiment, and a seventh embodiment. The processing chambers 500a, 500b, 500c include one or more digital light processing assemblies 522, 524 disposed within the upper base member 236 and the one or more lower base members 242. The processing chamber 500a of FIG. 5A is similar to the processing chamber 200b of FIG. 2B, but the upper heating device 520 and the lower heating device 530 replace the upper heating device 220 and the lower heating device 230. The upper heating device 520 further includes an upper digital light processing (DLP) assembly 522 and the lower heating device 530 further includes a lower DLP assembly 524. The upper DLP assembly 522 and the lower DLP assembly 524 are connected to the controller 164. The controller 164 may control the DLP assemblies 522, 524, to control the distribution of radiant energy within the processing volume 202.

The upper heating device 520 is disposed on top of the upper cooling plate 155, the one or more upper base members 236 are disposed on the upper cooling plate 155. The one or more optical fibers 234 are connected to the one or more upper light sources 232 and the one or more upper base members 236. The upper DLP assembly 522 is disposed within the upper base member 236 and uses a digital micro mirror display (DMD) to direct light emitted by the one or more optical fibers 234 across the top surface 128 of the substrate 104. The upper heating device 520 is disposed on top of the upper window 204. The upper heating device 520 is configured to heat the top surface 128 of the substrate 104.

The lower heating device 530 is disposed on the bottom of the lower cooling plate 182, the one or more lower base members 246 are disposed on the lower cooling plate 182. The one or more optical fibers 244 are connected to the one or more lower light sources 242 and the one or more lower base members 246. The lower DLP assembly 524 is disposed within the lower base member 246 and uses a DMD to scatter light emitted by the one or more optical fibers 244 across the underside surface 170 of the support body 171. The lower heating device 530 is disposed on the bottom of the lower window 206.

The radiant energy emitted by the upper heating device 520 is shown as light beams 526, which are scattered towards different regions of the substrate 104. The one or more optical fibers 234 may be a bundle of a plurality of optical fibers 234. Each of the optical fibers 234 includes a separate radiant energy source, such as a separate upper light source 232. The radiant energy emitted by the lower heating device 530 is shown as light beams 528, which are scattered towards different regions of the substrate 104. The one or more optical fibers 244 may be a bundle of optical fibers 244, such that each of the optical fibers 244 includes a separate radiant energy source, such as a separate lower light source 242.

Alternatively to a DLP assembly, each of the upper DLP assembly 522 and the lower DLP assembly 524 may be replaced by a liquid crystal display (LCD) assembly. The LCD assemblies serve a similar purpose to the DLP assemblies, and may be used to scatter and control the radiant energy provided by the optical fibers 234.

The processing chamber 500b of FIG. 5B is similar to the processing chamber 500a of FIG. 5A, but the upper heating device 540 and the lower heating device 550 replace the upper heating device 520 and the lower heating device 530.

The upper heating device 540 includes an upper DLP assembly 522 disposed over the opening 238. In the processing chamber 500b, the upper light sources 232 are adjacent to the upper DLP assembly 522 and are configured to provide a concentrated light beam 552 to the upper DLP assembly 522, before the concentrated light beam 552 is redirected into light beams 554, which are dispersed across the substrate 104. The concentrated light beam 552 may be a plurality of light beams generated by light sources within the upper light sources 232, facilitating improved control and adjustability. The lower heating device 530 also includes a lower DLP assembly 524 disposed adjacent to and beneath the openings 248. The lower light sources 242 are configured to provide a concentrated light beam 556 to the lower DLP assembly 524. The concentrated light beam 556 is redirected into light beams 558 after contacting the lower DLP assembly 524 and are dispersed across the underside surface 170 of the support body 171. The concentrated light beam 556 may be a plurality of light beams generated by laser diodes within the lower light sources 242.

The processing chamber 500c of FIG. 5C is similar to the processing chamber 500a of FIG. 5A and the processing chamber 500b of FIG. 5B, but the upper heating devices 520, 540 and the lower heating devices 530, 550 are replaced by the upper heating device 560 and the lower heating device 570. The upper heating device 560 includes an upper DLP assembly 522 disposed over the opening 238 and a laser source 562 disposed through a sidewall of the chamber body 201, such that the laser source 562 is disposed through the chamber side liner 210. In the processing chamber 500c, the laser source 562 is configured to provide a concentrated light beam 552 to the upper DLP assembly 522, before the concentrated light beam 552 is redirected into light beams 554, which are dispersed across the substrate 104. The concentrated light beam 552 may be a plurality of light beams generated by laser diodes within the laser source 562. The lower heating device 570 also includes a lower DLP assembly 524 disposed adjacent to and beneath the openings 248 and a laser source 566 disposed through (or mounted to) the sidewall of the chamber body 201, such that the laser source 566 is disposed through (or mounted to) the chamber side liner 210. In some embodiments, there may be multiple laser sources 566. The laser source 566 is configured to provide a concentrated light beam 556 to the lower DLP assembly 524. The concentrated light beam 556 is redirected into light beams 558 after contacting the lower DLP assembly 524 and are dispersed across the underside surface 170 of the support body 171. The concentrated light beam 556 may be a plurality of light beams generated by laser diodes within the lower light sources 242.

The laser sources 562, 566 emit the concentrated light beams 552, 556 into the processing volume 202. The upper DLP assembly 522 includes a DMD assembly 564 for reflecting the concentrated light beams 552 into light beams 554. The lower DLP assembly 524 includes a DMD assembly 568 for reflecting the concentrated light beams 556 into light beams 558.

It is estimated that while using embodiments such as those shown in FIGS. 1A and 1B, approximately 10% of the energy emitted by the laser assemblies 300 is absorbed by the upper window 110 and the lower window 112. Therefore, the use of the upper window 204 and the lower window 206 as shown in FIGS. 2A-2B improves efficiency of the laser heating system described herein by allowing the conical beam 324 to pass unobstructed through openings through the windows. The window openings 212 each include an anti-reflective coating disposed on the window opening walls 304. The anti-reflective coating makes the window openings 212 nearly 99% transparent.

The use of laser assemblies 300 for heating of the substrate 104 reduces overall cost of the system and increases control over the heating. Use of lasers increases control of the direction of application, improves heating process variability, and reduces the need for significant packaging and protection of the chamber. The use of the laser assemblies 300 also improves the accuracy of pyrometers within the processing chambers 200a, 200b. Pyrometer accuracy is improved because heating radiation wavelengths of the lasers are selected to be a significantly different wavelength than the wavelength measured by the pyrometer. The pyrometer can therefore filter out the noise created by the lasers using a narrow band filter. Radiation created by lamps is a broad radiation wavelength and creates significant noise within pyrometer measurements.

The light sources described herein may include light sources other than laser diodes connected to optical fibers. In some embodiments, the light sources are lamps or laser diodes coupled to a fiber laser. The fiber laser provides flexibility of the location of the light source, so that the light source does not have to be disposed on the lid of the processing chamber and can instead be placed adjacent to the processing chamber. This allows for other instruments to be placed on top of the processing chamber lid.

While the foregoing is directed to embodiments of the present disclosure, other and further embodiments of the disclosure may be devised without departing from the basic scope thereof, and the scope thereof is determined by the claims that follow.

What is claimed is:
1. A chamber for substrate processing comprising:
 a chamber body;
 a gas inlet disposed through a sidewall of the chamber body;
 a gas outlet disposed through a sidewall of the chamber body and opposite the gas inlet;
 an upper window;
 a lower window; and
 an upper heating device, the upper heating device further comprising:
  an upper cooling plate;
  one or more upper base members disposed on the upper cooling plate;
  one or more upper light sources;
  one or more optical fibers, each optical fiber included in the one or more optical fibers connected to at least one of the one or more upper light sources at a first end of the optical fiber and connected to at least one of the one or more upper base members at a second end of the optical fiber; and
  an irradiation window disposed within at least one of the one or more upper base members and between the one or more optical fibers and the upper window.
2. The chamber of claim 1, further comprising a lower heating device, the lower heating device comprising:
 a lower cooling plate;
 one or more lower base members disposed on the lower cooling plate;
 one or more lower light sources;
 one or more optical fibers connected to the one or more lower light sources at a first end and the lower base member at a second end; and an irradiation window disposed within the lower base member and between the one or more optical fibers and the lower window.

3. The chamber of claim 1, wherein the one or more upper light sources comprise ten or more light sources.

4. The chamber of claim 1, wherein the irradiation window further includes a lens for diverging a laser beam emitted by the one or more optical fibers into a conical beam.

5. The chamber of claim 1, wherein the upper cooling plate includes one or more coolant channels disposed therein.

6. The chamber of claim 1, wherein the upper window is a quartz window.

7. The chamber of claim 6, wherein the quartz window is a reflective quartz window with one or more window openings disposed therethrough.

8. The chamber of claim 6, wherein the upper window is a dome-shaped window.

9. The chamber of claim 1, wherein the upper cooling plate further comprises one or more openings disposed therethrough.

10. The chamber of claim 9, wherein the one or more openings have a conical frustum shape.

11. A chamber for substrate processing comprising:
an upper window; a chamber body;
a gas inlet disposed through a sidewall of the chamber body;
a gas outlet disposed through a sidewall of the chamber body and opposite the gas inlet;
a lower window;
an upper heating device, the upper heating device further comprising:
an upper cooling plate with one or more openings disposed therethrough;
one or more upper base members disposed on the upper cooling plate;
one or more upper light sources;
one or more optical fibers, each optical fiber included in the one or more optical fibers connected to at least one of the one or more upper light sources at a first end of the optical fiber and connected to at least one of the one or more upper base members at a second end of the optical fiber; and
an irradiation window disposed within at least one of the one or more upper base members and between the one or more optical fibers and the upper window; and
a lower heating device.

12. The chamber of claim 11, wherein the upper window is an upper quartz dome and the lower window is a lower quartz dome.

13. The chamber of claim 11, wherein the upper window is an upper reflective quartz liner and the lower window is a lower reflective quartz liner.

14. The chamber of claim 13, further comprising an opaque quartz body liner disposed on an inner surface of the chamber body.

15. The chamber of claim 14, wherein the upper window further comprises one or more window openings disposed therethrough and the lower window further comprises one or more window openings disposed therethrough.

16. The chamber of claim 15, wherein the one or more window openings have a shape of a conical frustum and a narrow portion of the conical frustum is adjacent the one or more upper base members.

17. The chamber of claim 16, wherein a wide portion of the conical frustum is adjacent to the upper window and is aligned with the one or more window openings disposed through the upper window.

18. A chamber for substrate processing comprising:
a chamber body;
a gas inlet disposed through a sidewall of the chamber body;
a gas outlet disposed through a sidewall of the chamber body and opposite the gas inlet;
an upper window;
a lower window;
a substrate support disposed between the upper window and the lower window;
an upper heating device, the upper heating device further comprising:
an upper cooling plate with a one or more openings disposed therethrough;
one or more upper base members disposed on the upper cooling plate;
one or more upper light sources;
one or more optical fibers, each optical fiber included in the one or more optical fibers connected to at least one of the one or more upper light sources at a first end of the optical fiber and connected to at least one of the one or more upper base members at a second end of the optical fiber, wherein a divergent laser is supplied by the one or more upper light sources to the one or more optical fibers; and
an irradiation window disposed within at least one of the one or more upper base members and between the one or more optical fibers and the upper window; and
a lower heating device.

19. The chamber of claim 18, wherein the irradiation window includes a coaxial lens.

20. The chamber of claim 18, wherein the upper window is disposed on a bottom surface of the upper cooling plate and the upper cooling plate is disposed on top of the chamber body.

* * * * *